US006969848B2

(12) United States Patent
Thompson et al.

(10) Patent No.: US 6,969,848 B2
(45) Date of Patent: Nov. 29, 2005

(54) METHOD OF CHEMICAL IONIZATION AT REDUCED PRESSURES

(75) Inventors: Bruce A. Thompson, Toronto (CA); Charles L. Jolliffe, Schomberg (CA)

(73) Assignee: MDS Inc., Concord (CA)

( * ) Notice: Subject to any disclaimer, the term of this patent is extended or adjusted under 35 U.S.C. 154(b) by 415 days.

(21) Appl. No.: 10/316,933

(22) Filed: Dec. 12, 2002

(65) Prior Publication Data

US 2003/0111600 A1 Jun. 19, 2003

Related U.S. Application Data

(60) Provisional application No. 60/339,465, filed on Dec. 14, 2001.

(51) Int. Cl.[7] .............................................. H01L 49/10
(52) U.S. Cl. .................... 250/288; 250/423 R; 250/424
(58) Field of Search .......................................... 250/288

(56) References Cited

U.S. PATENT DOCUMENTS 5,663,561 A 9/1997 Franzen et al.
5,961,772 A * 10/1999 Selwyn .................. 156/345.39
5,965,884 A 10/1999 Laiko et al.
6,335,525 B1 * 1/2002 Takada et al. .............. 250/288
6,515,280 B1 * 2/2003 Baykut ........................ 250/288
6,627,881 B1 * 9/2003 Bertrand et al. ............ 250/288
2002/0145110 A1 * 10/2002 Holle ......................... 250/287

FOREIGN PATENT DOCUMENTS

EP 0 560 537 A 9/1993
WO WO 99/38185 7/1999

* cited by examiner

*Primary Examiner*—John R. Lee
*Assistant Examiner*—James J. Leybourne
(74) *Attorney, Agent, or Firm*—Bereskin & Parr

(57) ABSTRACT

This invention comprises an apparatus and method for generating sample ions from sample molecules in which a mixture of a sample and a matrix are vaporized by a laser beam and Subsequently ionized by reagent corona ions. The decoupling of the vaporization and ionization steps allows each process to be separately optimized. The vaporization step can be done in a sub-atmospheric pressure region. Alternatively, the vaporization and ionization steps can be done in a higher pressure region. In addition, the reagent corona ions can be generated in a vacuum chamber or a chamber at atmospheric pressure. Alternatively, the reagent ions can be generated in a sub-atmospheric region while the laser desorption occurs in an atmospheric region.

28 Claims, 6 Drawing Sheets

METHOD OF CHEMICAL IONIZATION AT REDUCED PRESSURES

FIELD OF THE INVENTION

The invention relates to mass spectrometry. More particularly, this invention relates to a method of and an apparatus for ionizing a sample in which vaporization and ionization of the sample are carried out separately.

BACKGROUND OF THE INVENTION

Presently, known methods of creating ions from non-vaporizable molecules fall into two general categories: Electrospray Ionization (ESI) and desorption/ionization from a solid surface.

The ESI technique typically involves spraying a liquid, containing the sample molecules at atmospheric pressure, from a capillary which is at a high voltage relative to an orifice in a sampling plate. A high electric field at the capillary tip from which the liquid flows causes the liquid to become charged. This charged liquid eventually disperses into charged droplets which are drawn towards the sampling plate by the electric field. The region between the capillary tip and the sampling plate is at atmospheric pressure to provide energy to promote desolvation of the droplets. After evaporation of the solvent, either before or after the sampling plate, there are sample ions that may be singly or multiply charged (depending on the structure of the molecule). These sample ions are drawn through the sampling plate orifice into a reduced pressure region of a mass spectrometer due to the flow of background gas from the atmospheric pressure region, between the capillary tip and the sampling plate, to the sub-atmospheric pressure region in the mass spectrometer. Typically, the sub-atmospheric pressure region in the mass spectrometer is at a pressure of less than $10^{-5}$ Torr. The sample ions may pass through one or two chambers of intermediate pressure before reaching the high vacuum region of the mass spectrometer.

The most common of the desorption/ionization techniques is Matrix Assisted Laser Desorption Ionization (MALDI) which is most commonly used with a Time-Of-Flight (TOF) mass spectrometer. Typically, the sample and a matrix, such as 2,5-dihydroxybenzoic acid, are both dissolved in appropriate solvents, mixed and deposited on a solid probe surface. The probe effectively becomes an ion source. Once the liquid from the mixture has evaporated, the probe is inserted through vacuum locks into the high vacuum region of a mass spectrometer. A laser beam, often from a 337 nm nitrogen laser, is subsequently pulsed onto the probe surface vaporizing a small amount of dried matrix and sample molecules to form a plume or jet traveling out from the probe surface. The matrix material is specifically chosen to absorb the laser energy in order to rapidly heat and vaporize the sample molecules that it carries. Thus, ionization of at least some of the sample molecules occurs in the plume.

While the detailed mechanisms of vaporization and ionization are not fully understood, most currently accepted models propose that the matrix molecules become ionized in the plume or jet forming a micro-plasma. Neutral sample molecules which are carried away from the probe surface by the expanding micro-plasma then become ionized by charge transfer processes from the matrix ions in the micro-plasma. These processes occur in the micro-plasma only while the matrix ion and sample gas densities are high enough to allow interaction between the matrix ions and the sample molecules. Since the micro-plasma is generated by a laser pulse with a duration of a few nanoseconds focused to an area of less than 1 $mm^2$, the micro-plasma region of each laser pulse is confined to a region very close to the probe surface. In a typical MALDI system, laser pulses are generated at a rate of a few Hz (i.e. 10 or fewer pulses per second). Each generated pulse of ions is accelerated into the TOF mass spectrometer, and a mass spectrum is generated by recording the arrival times of the ions. Usually, the spectra from many laser pulses are added together to create a mass spectrum which can be interpreted.

In the conventional MALDI-TOF configuration described above, the probe surface containing the sample/matrix mixture must be located in a high vacuum region with a typical pressure of $10^{-6}$ Torr and more often $10^{-7}$ Torr. This is because the TOF mass spectrometer requires high voltages in order to accelerate the ions. Accordingly, a high vacuum is required in order to prevent electrical breakdown in the instrument. In addition, it is very important that the sample ions, formed in the small region close to the probe surface, do not undergo any further collisions with neutral molecules after being accelerated by the high voltage since any further collisions tend to cause the ions to fragment which is undesirable.

A recent development by a group at the University of Manitoba (WO 99/38185) describes the operation of a MALDI ion source in a low vacuum region at a pressure of approximately 10 mTorr (or even up to 1 atmosphere if desired). Ions are generated from a probe surface, as in a conventional MALDI system, but the ions are allowed to collide, at low energies, with a background gas (typically nitrogen) before being introduced into the mass spectrometer. This interaction, often described as collisional cooling, allows the ions to achieve a quasi-thermal equilibrium with the gas which removes all of the original energy of the ions that was induced by the expanding plume from the probe surface. The collisional cooling process also completely decouples the mass spectrometer from the ion source such that ionization parameters such as laser power, the sample's position on the probe surface and the like do not affect the quality of the mass spectrum. The collisional cooling process also converts the pulsed ion stream, formed by the laser pulses of nanosecond duration, into a quasi-continuous ion stream since the ion pulses are stretched in time by collisions with the background gas. After the ions undergo collisional cooling, the ions can be analyzed by any mass spectrometer such as an orthogonal TOF mass spectrometer, a quadrupole or an ion trap.

In any conventional MALDI system that operates at a reduced pressure, the analyte ions must be introduced through a vacuum lock into the source region of a TOF mass spectrometer. However, the MALDI-TOF vacuum locks required for sample introduction add complication and cost. Laiko et al. (U.S. Pat. No. 5,965,884) avoids the problem of vacuum locks by performing the MALDI process at atmospheric pressure. However, this technique suffers ion losses of at least 99% while transferring ions from an atmospheric pressure region to a reduced pressure region.

In the Laiko technique, the surface containing the sample and matrix is located in a region at atmospheric pressure. The surface is also in front of a small orifice that provides a passage to the TOF mass spectrometer chamber. A laser pulse generates ions by the MALDI process at atmospheric pressure and the resulting ion plume is drawn into the TOF mass spectrometer region by a gas flow or an electric field. This technique avoids the necessity of introducing the sample molecules into the vacuum system, however only a small fraction of the sample ions are sampled through the orifice. There are two reasons for the small fraction of ions sampled. The first reason is that the high gas density in the atmospheric pressure region prevents opposite polarity charges, in the micro-plasma of the plume, from separating sufficiently quickly. These opposite charges then recombine which changes a sample ion to a sample molecule thereby reducing the sample ion intensity. The second reason is that the diameter of the orifice that connects the atmospheric pressure region to the vacuum region in the TOF mass spectrometer must be very small so that vacuum pumps can maintain the high vacuum necessary for the operation of the TOF mass spectrometer and pumping requirements are kept reasonable. Accordingly, the resulting poor sampling efficiency through this small orifice reduces the sensitivity of this method compared to the conventional MALDI process discussed above.

Although the details of the MALDI process are not fully understood, most researchers agree that the ionization efficiency is very low, i.e. only 0.1 to 0.01% of the deposited sample molecules are actually converted into ions in the laser-created plasma. It seems likely that many sample molecules are carried away from the probe surface as a neutral species and are simply pumped away by the vacuum pumps. Therefore, if these sample molecules could be ionized, the sensitivity of the method would be greatly increased.

Franzen et al. (U.S. Pat. No. 5,663,561) attempted to address the very low ionization efficiency of the MALDI process by using a laser to desorb the matrix/sample mixture in an atmospheric pressure region and separate, unipolar reagent ions from a corona discharge to subsequently chemically ionize these sample molecules at atmospheric pressure. It is known that conventional atmospheric pressure chemical ionization (APCI) efficiencies can approach nearly 100% (under favorable thermodynamic conditions). In a conventional APCI source, the sample to be ionized is in a gaseous form. The gaseous sample then flows through a region where reagent ions are created. Under conditions where the reagent ions and sample gas are well mixed and where the interaction time is relatively long (i.e. several milliseconds or longer), the ionization efficiency can be very high.

In particular, Franzen teaches that the material from the vaporized MALDI plume is drawn through a corona discharge region. The vaporized matrix/sample ions are mixed with the reagent ions from the corona discharge in a tube connected to a small hole in a sample plate. The resulting ions are then transferred into the vacuum region of the mass spectrometer. However, similarly to the Laiko method, ions must still be transferred through a small orifice into the vacuum chamber for analysis typically by a TOF mass spectrometer. This configuration results in poor sample ion transmission efficiency. As such an ion loss of up to 99% occurs which reduces the practical utility of this method for trace analysis.

Accordingly, it is desirable to provide a method and an apparatus that results in a more sensitive MALDI process that can be used with a mass spectrometer system.

SUMMARY OF THE INVENTION

The present inventors have realized that a more sensitive MALDI process can be achieved by separating the vaporization and ionization steps and increasing the ion sampling efficiency. More particularly, it is proposed to perform the steps of desorption of the sample from a matrix material by a laser beam followed by ionization of the sample molecules by a high intensity reagent ion beam within a sub-atmospheric system. The decoupling of ionization and vaporization allows each process to be separately optimized. Furthermore, the sampling efficiency of ions created in the sub-atmospheric pressure region can be significantly greater than if the ions were formed in an atmospheric region. In addition, it is expected that the sample specificity of the matrix will be reduced because ionization of the matrix ions is not required. The high intensity flux of reagent ions can be injected into the sub-atmospheric system which avoids the losses associated with transmitting sample ions from a weak plasma in an atmospheric pressure region through a small pinhole to a sub-atmospheric region.

In one embodiment, reagent ions may be generated in an atmospheric pressure discharge, with the ion source adjacent to an orifice, defining an atmospheric-to-vacuum region interface, so that most of the reagent ions are directed through the orifice by a gas flow. A laser-desorbed sample is then mixed with the high intensity flow of reagent ions just downstream of the orifice in a sub-atmospheric pressure region where the laser-desorbed sample is ionized by ion-molecule reactions. Ionized sample molecules in these sub-atmospheric pressure regions can then be more efficiently focused into a mass spectrometer.

In a first aspect, the present invention describes a method of generating sample ions from sample molecules having the steps of:

(1) vaporizing the sample molecules to generate substantially neutral molecules;

(2) separately generating reagent ions in a first region; and (3) mixing the neutral molecules and the reagent ions in a vacuum chamber separate from the first region, wherein the vacuum chamber is at a substantially sub-atmospheric pressure to promote ionization of the neutral molecules to create sample ions, the sub-atmospheric pressure being approximately 10 Torr or less.

Alternatively, the vacuum chamber may be at a pressure of 10 mTorr or less. The method may also include the step of vaporizing the sample in a substantially atmospheric pressure region. Alternatively, the method may include vaporizing the sample in a sub-atmospheric pressure region. Furthermore, the method may include carrying out step (3) in a sub-atmospheric pressure region of a mass spectrometer.

The method may further comprise the step of:

(4) passing the sample ions into a mass spectrometer for analysis.

In the method, vaporizing the sample molecules may be effected by providing the sample molecules on a support plate and irradiating the sample molecules with a laser beam.

Alternatively, vaporizing the sample molecules may be effected by providing the sample molecules on a heatable element and heating the element to vaporize the sample.

Vaporizing the sample molecules to generate substantially neutral molecules may be further effected by providing the sample in a matrix on the support plate and irradiating the sample and the matrix with a laser beam having a frequency selected to be absorbed by the matrix to effect matrix assisted laser desorption.

In another aspect, the method may further comprise:

(a) providing a reagent ion source comprising a central electrode and a tubular electrode with an outlet opening which surrounds the central electrode, the central electrode having a sharp end and the tubular electrode defining a conduit for gas flow;

(b) providing a potential difference between the central electrode and the tubular electrode sufficient to generate a corona discharge between the sharp end of the central electrode and the outlet opening of the tubular electrode; and, (c) providing a gas flow through the tubular electrode to entrain corona ions as reagent corona ions.

Alternatively, the method may further comprise:

(a) providing a reagent ion source comprising a central electrode and an open-ended tubular electrode which surrounds the central electrode, the central electrode having a sharp end extending past the outer edge of the open-ended tubular electrode;

(b) providing a plug in the open-ended tubular electrode to prevent gas flow through the tubular electrode; and, (c) providing a potential difference between the central electrode and the open-ended tubular electrode to generate a corona discharge to generate corona ions.

In another aspect, the method may further include:

(a) providing the sample on a support plate within the vacuum chamber in which a substantially sub-atmospheric pressure is maintained; and, (b) providing an RF ion guide for collecting and focusing the sample ions.

The method may further include forming the reagent ions in a region external to the vacuum chamber.

Alternatively, the method may further include:

(a) providing the sample within a first chamber in which the sub-atmospheric pressure is maintained;

(b) providing the vacuum chamber with means for collecting and focusing the sample ions;

(c) providing a skimmer cone to separate the first chamber from the vacuum chamber, the skimmer cone having an orifice for receiving the sample ions, and, (d) maintaining the first chamber at a higher pressure than the vacuum chamber.

The method may further include forming the reagent ions within a region external to the vacuum chamber.

In another alternative, the method may further include:

(a) providing the sample around a first orifice on a support plate within a first chamber in which the sub-atmospheric pressure is maintained;

(b) providing the vacuum chamber with means for collecting and focusing the sample ions and a skimmer cone, with a second orifice, which separates the first chamber from the vacuum chamber;

(c) providing an electrode in a region exterior to the first chamber and an electric field between the electrode and the support plate to generate reagent ions; and, (d) directing the reagent ions towards the first chamber through the first orifice to react with the sample molecules to create sample ions.

In use, the region exterior to the first chamber is at atmospheric pressure and the first chamber is at a higher pressure than the vacuum chamber.

In yet another alternative, the method may further include:

(a) providing the vacuum chamber with means for collecting and focusing the sample ions and an orifice for receiving the sample molecules;

(b) providing the sample on a sample plate outside the vacuum chamber in a region at atmospheric pressure and immediately adjacent to the orifice; and, (c) providing the flow of reagent ions into the vacuum chamber at a location adjacent to the orifice.

In use, vaporized sample molecules pass through the orifice and expand in a free jet expansion into the vacuum chamber and simultaneously mix and react with the reagent ions to produce the sample ions. The method may further comprise providing a reagent gas in the region at atmospheric pressure.

In another aspect, the present invention comprises an apparatus, for generating sample ions from sample molecules. The apparatus comprises a sample plate for supporting a sample comprising sample molecules for vaporization and means for vaporizing the sample molecules. The apparatus also comprises a reagent ion generation means for generating a stream of reagent ions in a first region, and a vacuum chamber separate from the first region, the vacuum chamber being at a substantially sub-atmospheric pressure connected to the means for vaporizing the sample molecules and the reagent ion generation means. In use, the vaporized sample molecules and reagent ions mix in the vacuum chamber to promote ionization of the sample molecules to create sample ions and the vacuum chamber includes means for maintaining the substantially sub-atmospheric pressure at approximately 10 Torr or less.

Alternatively, the vacuum chamber is maintained at a substantially sub-atmospheric pressure of 10 mTorr or less.

The means for vaporizing the sample molecules may include a laser for delivering laser beams. Alternatively, the sample plate may include means for heating the sample plate to vaporize a sample provided thereon.

In addition, the reagent ion generation means may include a central electrode with a sharp end and a tubular electrode with an outlet opening. The tubular electrode surrounds the central electrode and defines a conduit for gas flow. The reagent ion generation means also includes means for providing a potential between the central electrode and the tubular electrode to form a corona discharge between the sharp end of the central electrode and the outlet opening of the tubular electrode. The reagent ion generation means also has a gas supply for supplying gas to the duct of the tubular electrode to provide a gas flow through the outlet opening to entrain reagent ions.

Alternatively, the reagent ion generation means may include a central electrode with a sharp end and an open-ended tubular electrode. The open-ended tubular electrode surrounds the central electrode and the sharp end of the central electrode extends past the tip of the open-ended tubular electrode. The reagent ion generation means also includes means for providing a potential between the central electrode and the open-ended tubular electrode to form a corona discharge between the sharp end of the central electrode and the open-ended tubular electrode. The reagent ion generation means also has a plug in the tubular electrode to prevent gas flow through the tubular electrode.

In one embodiment of the apparatus, the sample plate is provided within the vacuum chamber and the vacuum chamber has means for collecting and focusing the sample ions.

Alternatively, the sample plate may be provided in a first chamber and the first chamber may be separated from the vacuum chamber by a skimmer cone. Pumping means are provided to maintain the first chamber at a higher pressure than the vacuum chamber. The first chamber is at the sub-atmospheric pressure and the reagent ions and the sample molecules mix to form sample ions. The skimmer cone includes an orifice to allow the sample ions to pass into the vacuum chamber and the vacuum chamber has means for collecting and focusing the sample ions.

Alternatively, the apparatus may further comprise a first chamber, a skimmer cone which separates the first chamber from the vacuum chamber and an electrode external to the first chamber to generate an electric field between the electrode and the support plate to generate reagent ions at atmospheric pressure. The sample plate is provided in the first chamber around a first orifice and the reagent ions pass through the first orifice into the first chamber. The first chamber is at the sub-atmospheric pressure and the reagent ions mix with the sample molecules to form sample ions. The skimmer cone has a second orifice to allow the sample ions to pass into the vacuum chamber and the vacuum chamber has means for collecting and focusing the sample ions.

The vacuum chamber may include means for collecting and focusing the sample ions and an orifice for receiving the sample molecules. The sample plate may be located in an atmospheric pressure region outside of the vacuum chamber immediately adjacent to the orifice and there may be a means for introducing a flow of reagent ions into the vacuum chamber adjacent to the orifice. In use, vaporized sample molecules pass through the orifice and expand in a free jet expansion into the vacuum chamber and simultaneously mix and react with the reagent ions.

BRIEF DESCRIPTION OF THE DRAWINGS

For a better understanding of the present invention and to show more clearly how it may be carried into effect, reference will now be made, by way of example, to the accompanying drawings which show preferred embodiments of the present invention and in which.

DETAILED DESCRIPTION OF THE INVENTION

Figure 1:
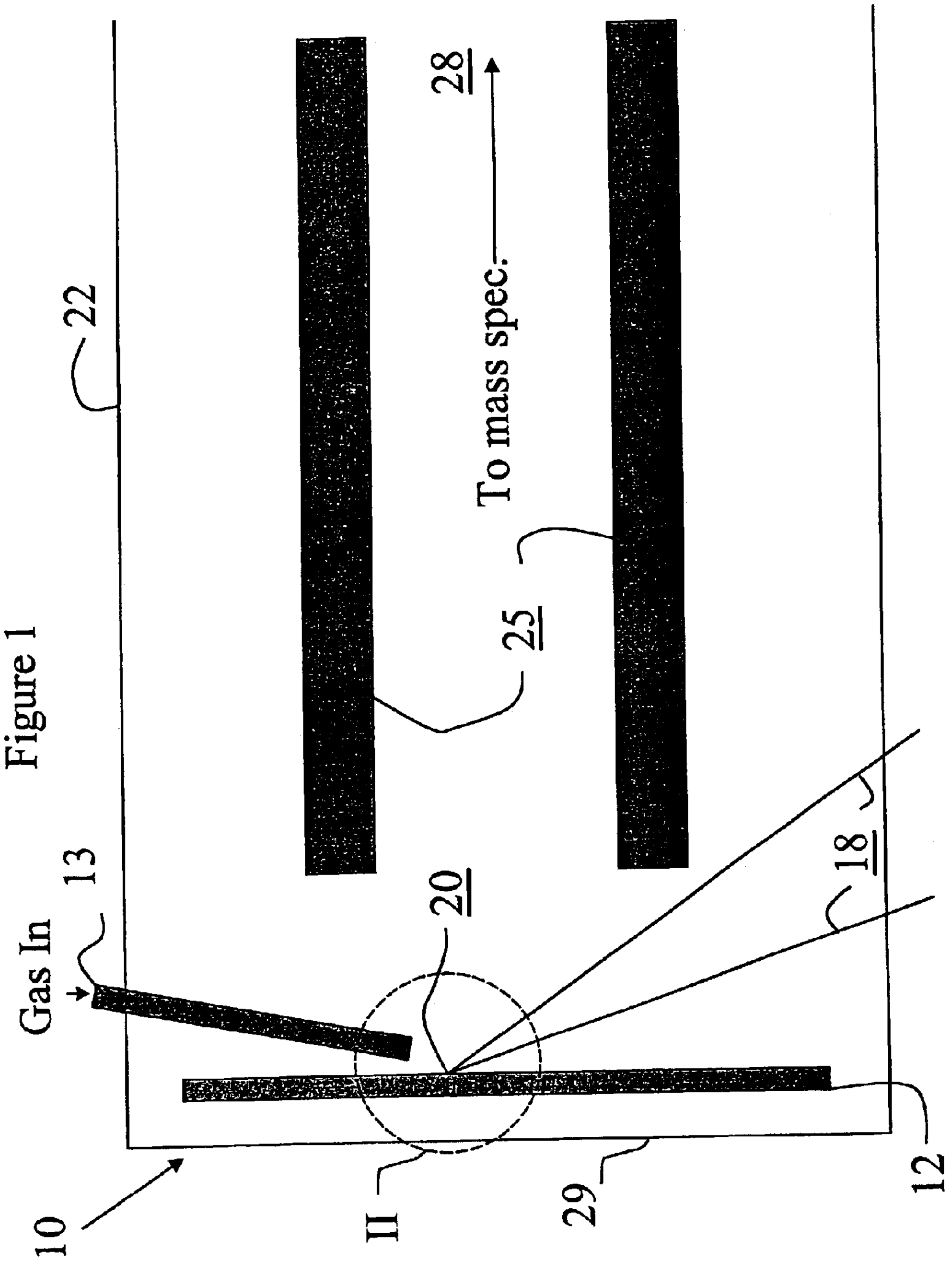
FIG. 1 is a schematic view of a first embodiment of an apparatus in accordance with the present invention.

Referring first to FIG. 1, a first embodiment of the present invention, indicated at 10, has a vacuum chamber 22 which provides the first chamber of a downstream mass spectrometer 28. The vacuum chamber 22 is maintained by conventional pumps (not shown) at a pressure of approximately 10 Torr to 10 mTorr or less. It would be understood that the vacuum chamber 22 could be the first chamber of any conventional mass spectrometer configuration. In particular, downstream from the vacuum chamber 22 there could be a conventional triple quadrupole mass spectrometer, including a first rod set for selecting ions of a desired mass-to-charge ratio, a second rod set configured as a collision cell for causing fragmentation of the selected ions, a third rod set for mass selecting a desired fragment ion and a detector. Alternatively, the vacuum chamber 22 could be connected, directly or indirectly, to a time-of-flight instrument. For example, the vacuum chamber 22 could be connected to a first rod set for selecting ions with a desired mass-to-charge ratio and a second rod set configured as a collision cell for causing fragmentation of the ions, with the fragment ions then passing to a time of flight instrument.

A matrix and sample are deposited on a spot 20 on a sample support plate 12 that is used as an electrode to establish an electric field. A focused laser beam, such as a laser pulse 18, from a laser (not shown) is then focused on the spot 20 on the sample support plate 12 to vaporize the sample and the matrix. A reagent ion discharge source 13 provides reagent ions and is directed towards the spot 20. The reagent ions ionize the sample molecules which were separated from the spot 20. A DC electric field is provided between the sample support plate 12 and the multipolar RF ion guide 25, or alternatively any RF ion guide, to drive the sample ions towards a downstream mass spectrometer indicated by an arrow 28. The electric field can be adjusted to optimize the sample signal in the downstream mass spectrometer 28. The adjustment procedure is obvious to one skilled in the art.

If the sample support plate 12 is not electrically conductive, an electric field can be established by additional electrodes (not shown) located between the sample support plate 12 and the end of the vacuum chamber 22 indicated at 29. Other electrodes (not shown) could also be used to optimize the ion flux into the multipolar RF ion guide 25. These electrodes could be placed near the spot 20, as is familiar to those trained in the art.

It is also possible to replace the sample support plate 12 with a very fine conductive filament (not shown), or another heatable element, upon which the matrix and sample are deposited. A very brief large current is then pulsed through the filament causing it to heat rapidly. The typically solid sample is thereby quickly vaporized, after which the sample molecules are chemically ionized by the nearby reagent ion flux from the reagent ion discharge source 13.

Figure 2:
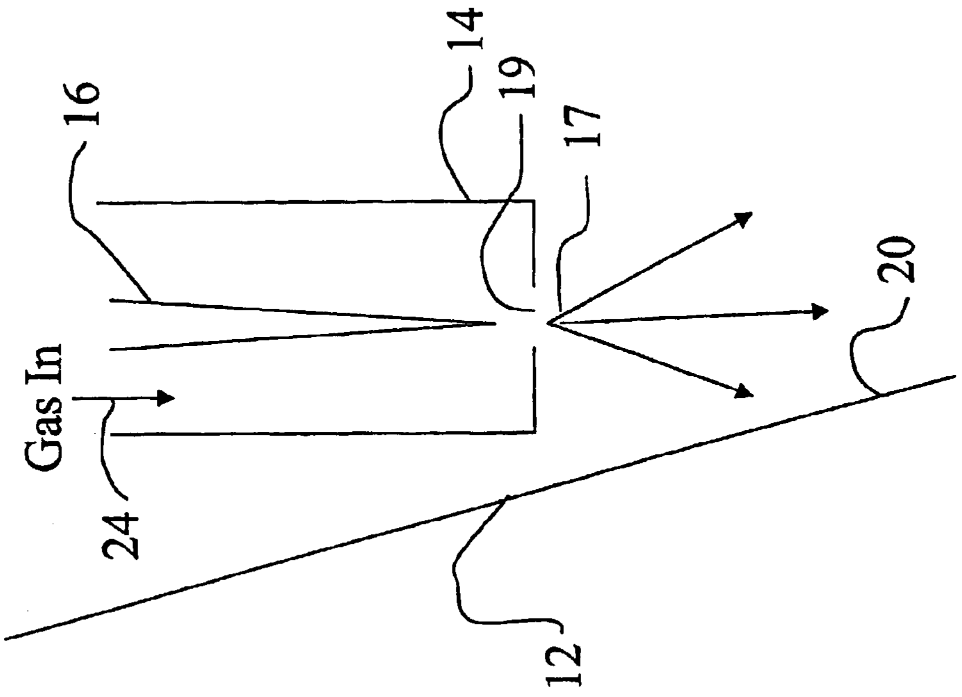
FIG. 2 is a schematic view, on an enlarged scale, of the area indicated at II in FIG. 1.

A more detailed illustration of the reagent ion discharge source 13 contained within the dashed circle II of FIG. 1 is shown in FIG. 2. FIG. 2 illustrates the delivery of reagent corona ions, shown as arrowed lines 17, to the spot 20 where the vaporized sample is located on sample support plate 12. Corona ions are created by a corona discharge which is produced by an electric field between an electrode 16 and a corona tube 14 that acts as an outer tubular electrode that surrounds electrode 16. The corona tube 14 comprises a generally cylindrical tube and includes an outlet opening 19 in an end wall. The electrode 16 is shown with a sharp end at which the electric field is most intense. Consequently, the corona ions are generated at the sharp end of the electrode 16. Without a gas flow, these corona ions would strike the rim of the outlet opening 19 of the corona tube 14. Accordingly, a reagent gas flow 24, from a gas supply (not shown), is introduced to sweep a significant portion of the corona ions through the outlet opening 19. The reagent gas flow 24 is concurrently ionized by the corona discharge to form the reagent corona ions. As is well known, stable corona discharges of either polarity can be established over a wide range of pressures, mixtures of gases, and electrode configurations.

For this invention, it is important to have the corona discharge occur in a region where there is a high gas flow velocity. The high gas flow velocity is needed to move a high proportion of the reagent corona ions into the region of the vaporized sample molecules so that the sample molecules may be chemically ionized by the reagent corona ions. The speed of this chemical ionization process will be affected by the local gas density in the vicinity of the spot 20. However, it is difficult to get a high local gas density due to the mechanical complexity required. For example, the well known free jet expansion theory predicts that for a gas at atmospheric pressure in the corona tube 14, and a diameter of 0.125 mm for the outlet opening 19, the local pressure will be $1/100^{th}$ of an atmosphere 0.5 mm downstream of the opening of the corona tube 14 and dropping rapidly. At the same time, it is desirable to minimize the reagent gas flow 24 into the vacuum chamber 22 to minimize pumping requirements. The vacuum chamber 22 is usually maintained at a pressure in the range of 10 Torr to 10 mTorr. This can be done by reducing the pressure of the reagent gas in the corona tube 14 to below one atmosphere.

In order to control the average ion current into the mass spectrometer, it is also possible to pulse the corona discharge ions in concert with the pulsing of the laser vaporization. The gas(es) used with the corona discharge may also be selected for their ability to chemically ionize the particular sample molecules while not ionizing other molecules such as the matrix molecules. Accordingly, the matrix can be chosen to have an inability to be ionized by many different reagent corona ion species. For example, the matrix may be composed of a non-polar compound, which has a low proton affinity (i.e. gas phase basicity), so that it is not protonated by the reagent corona ions which will in general be a protonating species. Alternately, it may be advantageous to provide reagent ions which can act as charge transfer reagents. For example, benzene or toluene could be used as a reagent gas to form molecular M+ ions which can ionize certain species of sample molecules which have a lower ionization potential. Accordingly, the matrix may be selected to have a high ionization potential so that the matrix molecules are not ionized by the reagent ions. Furthermore, the laser pulse 18 should have a frequency such that the laser pulse 18 can be absorbed by the matrix to effect matrix assisted laser desorption. It is expected that characteristics such as laser energy, spot size and pulse frequency, can be optimized empirically in order to provide the best conditions for sample desorption and ionization by the reagent ions.

The configuration shown in FIG. 1 is desirable because ions are created in a region which is close to an RF ion guide such as a multipole or an RF ring guide. However, it is also possible for the laser desorption and Chemical Ionization (CI) process to occur in a higher pressure chamber located in front of the RF ion guide chamber such as in the configuration illustrated in FIG. 3. Here, a chamber 35, in which the laser desorption and CI process occurs, is at a pressure on the order of 1 Torr to 10 Torr (pumps not shown). The resulting sample ions are directed by gas flow through an orifice 21, as well as by an electric field between the corona electrode and the orifice 21 through the orifice 21 in a skimmer cone 26 into a vacuum chamber 22 which contains the multipolar RF ion guide 25. The vacuum chamber 22 is at a pressure of approximately 10 mTorr, although it may also be operated at a pressure as high as 1 Torr if chamber 35 is operated at 10 Torr. The choice of chamber pressures depends on the size of the chosen vacuum pumps, and the diameter of the orifice 21 in skimmer 26, which may be selected according to a desired combination of cost and sensitivity. The multipolar RF ion guide 25 efficiently captures and transmits the sample ions into the downstream mass spectrometer 28.

Figure 3:
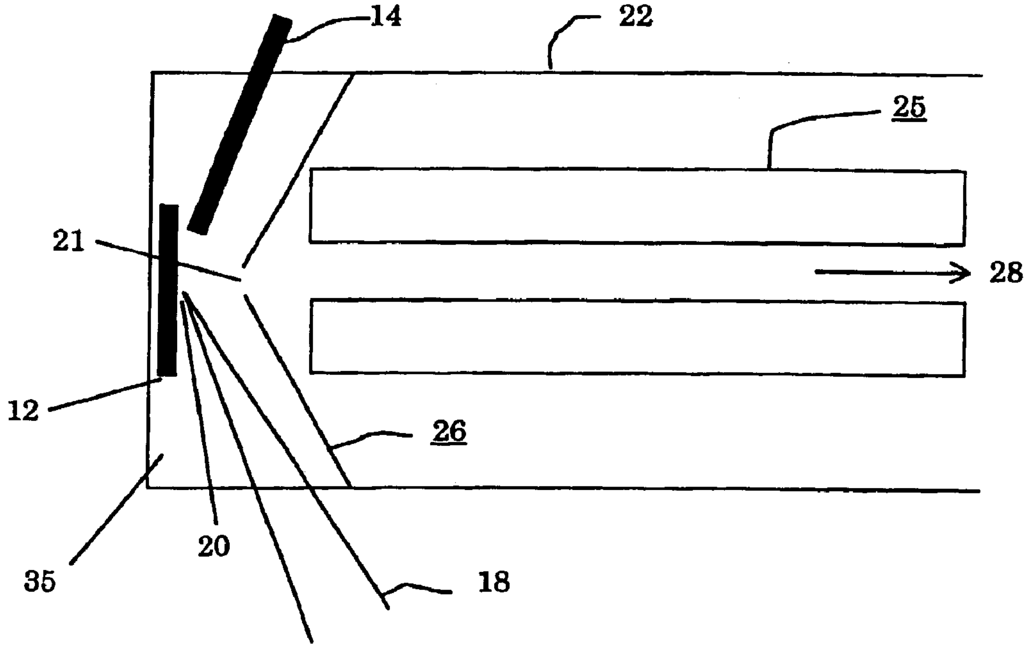
FIG. 3 is a schematic view of a higher pressure variation of the first embodiment of FIG. 1.

The advantage of the configuration shown in FIG. 3 is that the higher pressure in chamber 35 (10 Torr compared to 10 mTorr) allows more reactive collisions between the reagent ions and the sample molecules which may increase the production of sample ions thereby increasing the sample ion intensity. However, consideration must be given to the fact that while the sample ion intensity may be improved by increasing the pressure in chamber 35, and therefore the reaction time, some sample ion losses will be encountered when the sample ions pass through the orifice 21 in the skimmer cone 26. These sample ion losses can be minimized by ensuring that the reaction region is in close proximity to the opening of the skimmer cone 26. Furthermore, some optimization of the combination of the pressure in chamber 35 and the diameter of the orifice 21 in the skimmer cone 26 will be necessary while maintaining the pressure in the multipolar RF ion guide 25 at approximately 10 mTorr or less.

Figure 4:
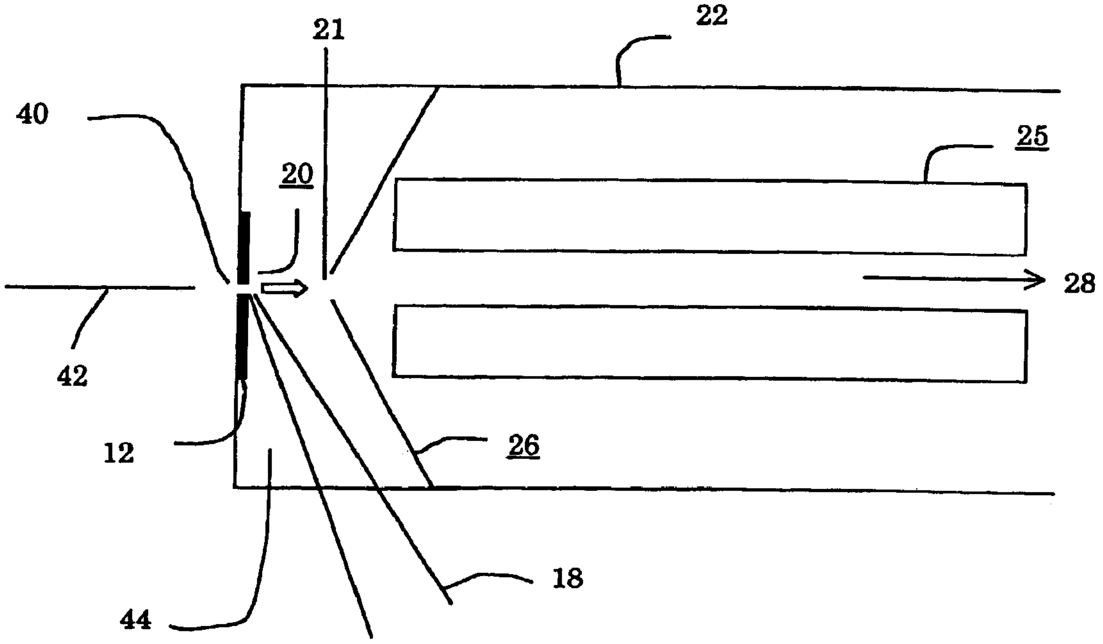
FIG. 4 is a schematic view of a second embodiment of an apparatus in accordance with the present invention.

Another alternate embodiment is shown in FIG. 4. In this configuration, the sample is deposited on the low pressure side of a sample support plate 12 in a region that surrounds an orifice 40. In a higher pressure region, at approximately atmospheric pressure for example, reagent corona ions, generated by an electric field between an electrode 42 and the sample support plate 12, are directed into a first vacuum chamber 44 through an orifice 40 by a gas flow and by the electric field between the electrode 42 and the outside of the sample support plate 12. Alternatively, an electric field may be used. The pressure on the low pressure side of the sample support plate 12 may be approximately 10 Torr, or as low as a few mTorr, depending upon the diameter of the orifice 40 and the size of the vacuum pump (not shown). A focused laser pulse 18 desorbs the deposited sample and matrix that are positioned in close proximity to the orifice 40. The configuration shown in FIG. 4 ensures thorough mixing and a high degree of interaction between the sample molecules and the reagent corona ions. The diameter of the orifice 40 is typically 0.1 mm to 0.25 mm and the diameter of the spot 20 is typically 0.3 mm to 0.5 mm so that desorption will occur all around the orifice 40.

The material desorbed by the focused laser pulse 18 is immediately mixed with reagent corona ions which enter through the orifice 40. However, the sample and matrix must not block the orifice 40 through which the reagent corona ions enter. This may be ensured by placing a fine wire in the orifice 40 while the sample material is deposited and dried and then removing the wire before introducing the reagent corona ions through the orifice 40. This approach may also lend itself to a batch sample method in which there is a sample support plate containing multiple sample regions, each having its own orifice. The sample support plate could then be moved in front of the mass spectrometer to present each sample in turn to the laser desorption process and the reagent corona ions. Only one sample orifice would be open to the vacuum chamber 22 at one time while the other sample orifices would be blocked off.

The configuration of FIG. 4 also enables the electrode 42 to be easily replaced by an electrospray or ionspray source in order to observe electrospray ions. This is an ion source technique described by U.S. Pat. No. 4,861,988.

Figure 5:
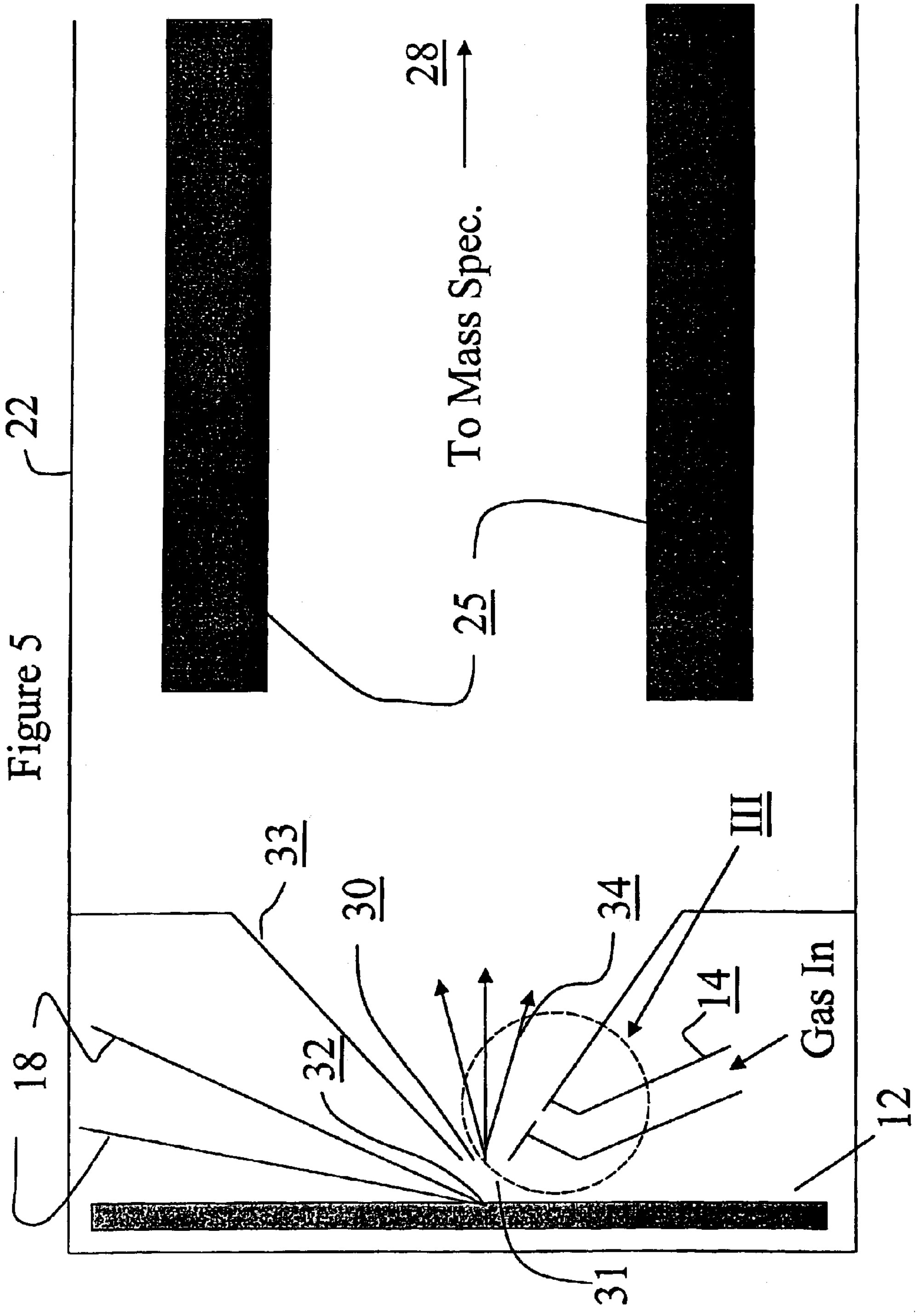
FIG. 5 is a schematic view of a third embodiment of an apparatus in accordance with the present invention.

Referring now to FIG. 5, another embodiment of the present invention is shown in which the reagent corona ions chemically ionize sample molecules in a sub-atmospheric pressure region while the sample molecules are vaporized at substantially atmospheric pressure. On sample support plate 12, a focused laser pulse 18 vaporizes the spot 32 where a mixture of sample molecules and an appropriate matrix are located. The region 31 between the sample support plate 12 and a skimmer cone 33 leading to a vacuum chamber 22 is substantially at atmospheric pressure. Similarly to the embodiment depicted in FIG. 1, vacuum pumps (not shown) provide a reduced pressure region within the vacuum chamber 22 which receives gas from region 31 through an orifice 30 in skimmer cone 33. The vaporized sample and matrix molecules are entrained within the flow of atmospheric gas that is shown by arrowed lines 34 in FIG. 5. Reagent corona ions are then added via the corona tube 14 to promote chemical ionization of the mostly neutral flux of vaporized sample and matrix molecules in a rapidly dropping pressure region which is typical of free jet expansions. The reagent corona ions subsequently ionize the sample and matrix molecules. The ionized molecules then typically enter a multipolar RF ion guide 25 which focuses and directs the ionized molecules to a downstream mass spectrometer 28 as in the first embodiment.

Figure 6B:
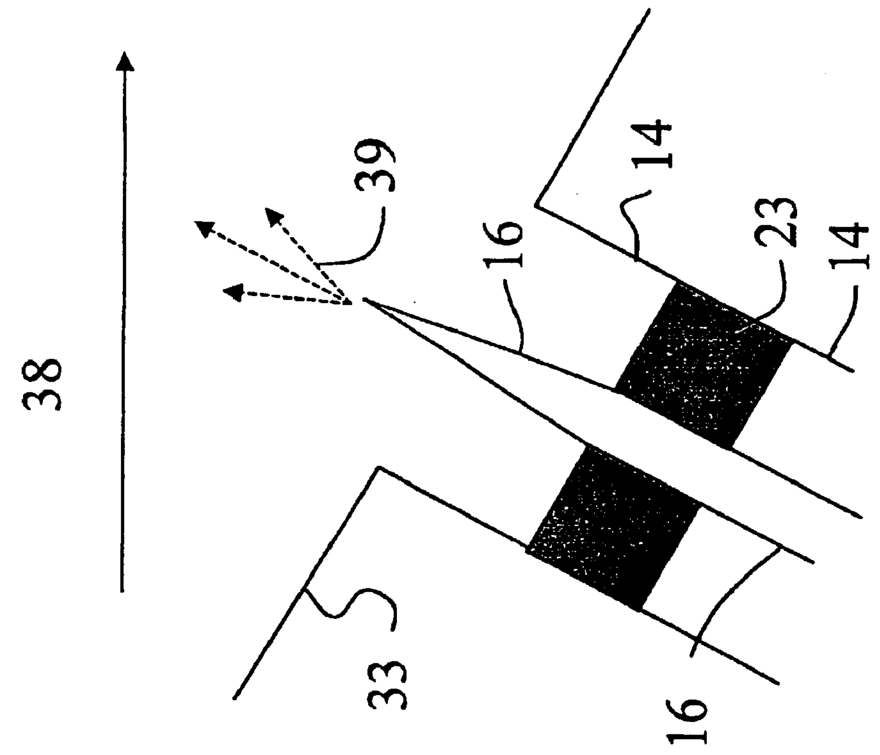
FIG. 6*a* is a schematic view, on an enlarged scale, of the area indicated at III in FIG. 5; and, FIG. 6*b* is a schematic view, on an enlarged scale, of an alternate embodiment of the area indicated at III in FIG. 5.
Figure 6A:
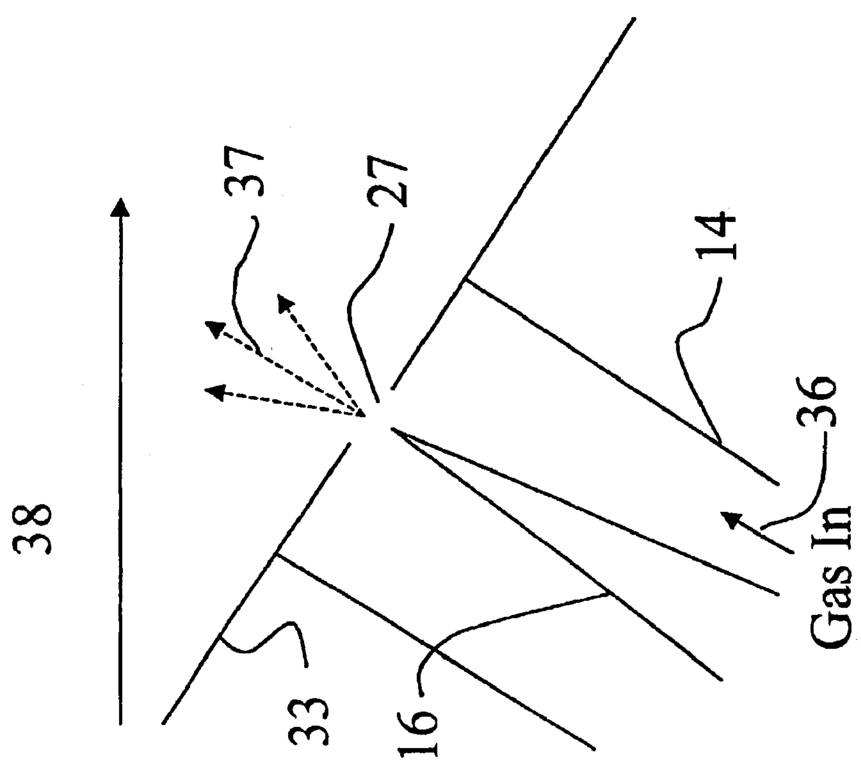

FIGS. 6*a*, and 6*b* show two variations for the dashed circular region III of FIG. 5 in which the reagent corona ions mix with the neutral sample molecular flow. In FIG. 6*a*, a potential difference is provided between the electrode 16 and the corona tube 14 which is mounted on a side of the skimmer cone 33. The skimmer cone 33 is joined to the corona tube 14 so as to form an end wall. An outlet 27 is provided in the skimmer cone 33 that corresponds to the outlet opening 19 in FIG. 2. A significant portion of the reagent corona ions 37 are swept by the corona tube gas flow 36 into the neutral molecular flow 38. Mixing of the reagent corona ions with the vaporized sample molecules causes these sample molecules to become chemically ionized.

FIG. 6*b* illustrates an alternative for mixing the reagent corona ions with the neutral sample molecular flow of FIG. 6*a* wherein the surface of the skimmer cone 33 does not extend past the sides of the corona tube 14 (which appears as an open-ended tubular electrode) and the electrode 16 extends into the interior of the skimmer cone 33. The skimmer cone 33 acts as an outer wall. A potential difference is applied between the electrode 16 and the skimmer cone 33. Extra gas load is prevented by a plug 23 which blocks any gas flow through the corona tube 14 and also acts as an electrical insulator. Hence, the flow of corona ions 39 is generated directly in the interior of the skimmer cone 33. The possibility of adding reagent gas to greatly increase sample ionization may be accomplished by adding the reagent gas to the region 31 of FIG. 5 so that the reagent gas will be drawn in through orifice 30.

A corona discharge can only be obtained if adequate pressures are present. For example, the suggested pressure of 10 mTorr in FIG. 1 is insufficient to enable a corona discharge to occur. For this reason, the electrode 16 is mounted within the corona tube 14 to enable a localized high pressure region to be provided between the electrode 16 and the outer wall of the corona tube 14 which acts as an electrode as shown in FIG. 2. This enables an adequate corona discharge to occur. Similarly, in FIG. 6*b*, the pressure in the skimmer cone 33 would need to be adjusted to enable a corona discharge to occur. However, since the low pressure environment requires a lower electric field to generate a corona discharge than is required at atmospheric pressure, the gas flow should be able to drag the reagent corona ions relatively easily into the region of neutral molecular flow 38.

As noted above, in FIG. 5, the region around the spot 32 could be flooded with a desired gas or gas composition to ensure that the neutral sample molecules are passed into the vacuum chamber 22 with a desired gas composition. Preferably, this gas should be selected so as to interact minimally with the reagent ions, both so as to avoid reducing reagent ions available for ionizing the sample molecules and to avoid the generation of unnecessary background ions.

Although the embodiments described herein employ multipolar RF ions guides (typically understood to refer to RF quadrupoles, RF hexapoles, RF octapoles and the like), it should be understood that other RF ion guide devices, such as RF ring guides or tapered RF ring guides (sometimes referred to as ion funnels), could also be employed. The purpose of these devices is to provide ion confinement and collisional focusing, and their use is not fundamental to the invention, except as they provide higher sensitivity by means of improved ion transmission efficiency. Other ion focusing or transmission devices may be used to similar benefit.

It should be understood that various modifications can be made to the preferred embodiments described and illustrated herein, without departing from the present invention, the scope of which is defined in the appended claims.

What is claimed is:

1. A method of generating sample ions from sample molecules, the method comprising the steps of:

(1) vaporizing the sample molecules to generate substantially neutral molecules;

(2) separately generating reagent ions in a first region; and, (3) mixing the neutral molecules and the reagent ions in a vacuum chamber separate from the first region, wherein the vacuum chamber is at a substantially sub-atmospheric pressure to promote ionization of the neutral molecules to create sample ions, the sub-atmospheric pressure being approximately 10 Torr or less.

2. A method as claimed in claim 1, wherein the substantially sub-atmospheric pressure is approximately 10 mTorr or less.

3. A method as claimed in claim 1, wherein the method further comprises the step of:

(4) passing the sample ions into a mass spectrometer for analysis.

4. A method as claimed in claim 1, wherein vaporizing the sample molecules is effected by irradiating the sample molecules on the support plate with a laser beam.

5. A method as claimed in claim 1, wherein vaporizing the sample molecules is effected by providing a heatable element on the support plate and heating the element to vaporize the sample molecules.

6. A method as claimed in claim 1, which includes vaporizing the sample molecules to generate substantially neutral molecules by providing the sample in a matrix on the support plate and irradiating the sample and the matrix with a laser beam having a frequency selected to be absorbed by the matrix to effect matrix assisted laser desorption.

7. A method as claimed in claim 1, wherein the method further comprises:

a) providing a reagent ion source comprising a central electrode and a tubular electrode with an outlet opening which surrounds the central electrode, the central electrode having a sharp end and the tubular electrode defining a conduit for gas flow;

b) providing a potential difference between the central electrode and the tubular electrode sufficient to generate a corona discharge between the sharp end of the central electrode and the outlet opening of the tubular electrode; and, c) providing a gas flow through the tubular electrode to entrain corona ions as reagent corona ions.

8. A method as claimed in claim 1, wherein the method further comprises:

a) providing a reagent ion source comprising a central electrode and an open-ended tubular electrode which surrounds the central electrode, the central electrode having a sharp end extending past the outer edge of the open-ended tubular electrode;

b) providing a plug in the open-ended tubular electrode to prevent gas flow through the tubular electrode; and, c) providing a potential difference between the central electrode and the open-ended tubular electrode to generate a corona discharge to generate corona ions.

9. A method as claimed in claim 1, wherein the method further includes:

a) providing the sample on a support plate within a first chamber in which the sub-atmospheric pressure is maintained;

b) providing the vacuum chamber with means for collecting and focusing the sample ions;

c) providing a skimmer cone to separate the first chamber from the vacuum chamber, the skimmer cone having an orifice for receiving the sample ions; and, d) maintaining the first chamber at a higher pressure than the vacuum chamber.

10. A method as claimed in claim 1, wherein the method further includes:

a) providing the sample around a first orifice on a support plate within a first chamber in which the sub-atmospheric pressure is maintained;

b) providing the vacuum chamber with means for collecting and focusing the sample ions and a skimmer cone, with a second orifice, which separates the first chamber from the vacuum chamber;

c) providing an electrode in a region exterior to the first chamber and an electric field between the electrode arid the support plate to generate reagent ions; and, d) directing the reagent ions towards the first chamber through the first orifice to react with the sample molecules to create sample ions, whereby, in use, the region exterior to the first chamber is at atmospheric pressure and the first chamber is at a higher pressure than the vacuum chamber.

11. A method as claimed in claim 1, wherein the method further includes:

a) providing the vacuum chamber with means for collecting and focusing the sample ions and an orifice for receiving the sample molecules;

b) providing the sample located on a sample support outside the vacuum chamber in a region at atmospheric pressure and immediately adjacent to the orifice; and c) providing the flow of reagent ions into the vacuum chamber at a location adjacent to the orifice, whereby, in use, vaporized sample molecules pass through the orifice and expand in a free jet expansion into the vacuum chamber and simultaneously mix and react with the reagent ions to produce the sample ions.

12. A method as claimed in claim 11, wherein step (b) further comprises providing a reagent gas in the region at atmospheric pressure.

13. A method as claimed in claim 9, wherein the reagent ions are formed in a region external to the vacuum chamber.

14. A method as claimed in claim 10, wherein the reagent ions are formed within a region external to the vacuum chamber.

15. A method as claimed in claim 1, wherein the method includes vaporizing the sample in a substantially atmospheric pressure region.

16. A method as claimed in claim 1, wherein the method includes vaporizing the sample in a sub-atmospheric pressure region.

17. An apparatus, for generating sample ions from sample molecules, the apparatus comprising:

a sample plate for supporting a sample comprising sample molecules for vaporization;

means for vaporizing the sample molecules;

reagent ion generation means for generating a stream of reagent ions in a first region; and, a vacuum chamber separate from the first region, the vacuum chamber being at a substantially sub-atmospheric pressure and connected to the means for vaporizing the sample molecules and the reagent ion generation means, whereby, in use, the vaporized sample molecules and reagent ions mix in the vacuum chamber, to promote ionization of the sample molecules to create sample ions and the vacuum chamber includes means for maintaining the substantially sub-atmospheric pressure at approximately 10 Torr or less.

18. An apparatus as claimed in claim 17, wherein the substantially sub-atmospheric pressure in the vacuum chamber is maintained at a pressure of approximately 10 mTorr or less.

19. An apparatus as claimed in claim 17, wherein the means for vaporizing the sample molecules includes a laser for delivering laser beams.

20. An apparatus as claimed in claim 17, wherein the sample plate includes means for heating the sample plate to vaporize a sample provided thereon.

21. An apparatus as claimed in claim 17, wherein the reagent ion generation means includes:

a central electrode with a sharp end;

a tubular electrode with an outlet opening, the tubular electrode surrounding the central electrode and defining a conduit for gas flow;

means for providing a potential between the central electrode and the tubular electrode to form a corona discharge between the sharp end of the central electrode and the outlet opening of the tubular electrode; and, a gas supply for supplying gas to the duct of the tubular electrode to provide a gas flow through the outlet opening to entrain reagent ions.

22. An apparatus as claimed in claim 17, wherein the reagent ion generation means includes:

a central electrode with a sharp end;

an open-ended tubular electrode, the open-ended tubular electrode surrounding the central electrode, the sharp end of the central electrode extending past the tip of the open-ended tubular electrode;

means for providing a potential between the central electrode and the outer wall to form a corona discharge between the sharp end of the central electrode and the open-ended tubular electrode; and, a plug in the tubular electrode to prevent gas flow through the tubular electrode.

23. An apparatus as claimed in claim 21, wherein the sample plate is provided within the vacuum chamber and the vacuum chamber has means for collecting and focusing the sample ions.

24. An apparatus as claimed in claim 21, wherein the sample plate is provided in a first chamber and the first chamber is separated from the vacuum chamber by a skimmer cone, wherein pumping means is provided to maintain said first chamber at a higher pressure than the vacuum chamber, wherein the first chamber is at the sub-atmospheric pressure and the reagent ions and the sample molecules mix to form the sample ions and the skimmer cone includes an orifice to allow the sample ions to pass into the vacuum chamber and the vacuum chamber has means for collecting and focusing the sample ions.

25. An apparatus as claimed in claim 17, the apparatus further comprising:

a first chamber;

a skimmer cone which separates the first chamber from the vacuum chamber; and, an electrode external to the first chamber to generate an electric field between the electrode and the support plate to generate reagent ions at atmospheric pressure, wherein the sample plate is provided in the first chamber around a first orifice, the reagent ions pass through the first orifice into the first chamber, wherein the first chamber is at the sub-atmospheric pressure and the reagent ions mix with the sample molecules to form sample ions and the skimmer cone has a second orifice to allow the sample ions to pass into the vacuum chamber and the vacuum chamber has means for collecting and focusing the sample ions.

26. An apparatus as claimed in claim 17, wherein the vacuum chamber includes means for collecting and focusing the sample ions and an orifice for receiving the sample molecules, the sample plate is located in an atmospheric pressure region outside of the vacuum chamber immediately adjacent to the orifice and there is a means for introducing a flow of reagent ions into the vacuum chamber adjacent to the orifice, whereby, in use, vaporized sample molecules pass through the orifice and expand in a free jet expansion into the vacuum chamber and simultaneously mix and react with the reagent ions.

27. A method of generating sample ions from a sample, the method comprising the steps of:

(1) providing the sample around a first orifice on a support plate within a first chamber in which a substantially sub-atmospheric pressure is maintained and vaporizing the sample to generate substantially neutral sample molecules;

(2) providing an electrode in a region exterior to the first chamber and an electric field between the electrode and the support plate to generate reagent ions in the region exterior to the first chamber;

(3) directing the reagent ions towards the first chamber through the first orifice to react with the sample molecules to create sample ions, and, (4) providing a vacuum chamber with means for collecting and focusing the sample ions and a skimmer cone, with a second orifice, which separates the first chamber from the vacuum chamber;

wherein, the region exterior to the first chamber is at atmospheric pressure and the first chamber is maintained at a sub-atmospheric pressure of approximately 10 Torr or less.

28. An apparatus for generating sample ions from a sample, the apparatus comprising:

a first chamber having a first orifice;

a sample plate for supporting the sample, the sample plate being provided in the first chamber around the first orifice;

means for vaporizing the sample molecules;

an electrode external to the first chamber to generate an electric field between the electrode and the support elate to generate reagent ions at atmospheric pressure;

a vacuum chamber connected to the first chamber and having means for collecting and focusing the sample ions; and, a skimmer cone which separates the first chamber from the vacuum chamber and having a second orifice to allow the sample ions to pass into the vacuum chamber;

wherein, the first chamber is at a substantially sub-atmospheric pressure of approximately 10 Torr or less and the reagent ions pass through the first orifice into the first chamber and mix with the vaporized sample molecules to promote ionization of the sample molecules to create the sample ions.

* * * * *

UNITED STATES PATENT AND TRADEMARK OFFICE
CERTIFICATE OF CORRECTION

PATENT NO. : 6,969,848 B2
APPLICATION NO. : 10/316933
DATED : November 29, 2005
INVENTOR(S) : Thomson, Bruce A. et al.

It is certified that error appears in the above-identified patent and that said Letters Patent is hereby corrected as shown below:

On Title Page Col. 1 and in item 75, the first inventor's last name --Thompson- has been changed to --Thomson-.

On Title Page Item (57) Col. 2
In the Abstract, line 4, the word --Subsequently- has been changed to --subsequently-, so that the line reads "beam and subsequently ionized by reagent corona ions. The".

column 5, line 36, the paragraph --The method may further include forming the reagent ions within a region external to the vacuum chamber.- has been deleted.

column 5, line 53, the paragraph --In use, the region exterior to the first chamber is at atmospheric pressure and the first chamber is at a higher pressure than the vacuum chamber.- has been deleted.

column 6, line 58, the second instance of the word --the- has been deleted, so that the line reads "than the vacuum chamber. The first chamber is at".

column 7, line 5, the first instance of the word --the- has been deleted, so that the line reads "chamber is at sub-atmospheric pressure and the reagent".

column 11, line 64, the word --ions- has been changed to --ion-, so that the line reads "tipolar RF ion guides (typically understood to refer to RF".

column 13, line 29, claim 10, section c, the word --arid- has been changed to --and-, so that the line reads "chamber and an electric field between the electrode and".

UNITED STATES PATENT AND TRADEMARK OFFICE

CERTIFICATE OF CORRECTION

PATENT NO. : 6,969,848 B2
APPLICATION NO. : 10/316933
DATED : November 29, 2005
INVENTOR(S) : Thomson, Bruce A. et al.

It is certified that error appears in the above-identified patent and that said Letters Patent is hereby corrected as shown below:

column 16, line 25, claim 28, the word --elate- has been changed to --plate- so that the line reads “plate to generate reagent ions at atmospheric pressure;”.

Signed and Sealed this

Eighth Day of August, 2006

JON W. DUDAS
*Director of the United States Patent and Trademark Office*